(12) United States Patent
Li et al.

(10) Patent No.: US 12,237,839 B2
(45) Date of Patent: Feb. 25, 2025

(54) DELAY LOCKED LOOP AND MEMORY

(71) Applicant: CHANGXIN MEMORY TECHNOLOGIES, INC., Hefei (CN)

(72) Inventors: Siman Li, Hefei (CN); Yoonjoo Eom, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 58 days.

(21) Appl. No.: 18/448,946

(22) Filed: Aug. 13, 2023

(65) Prior Publication Data

US 2024/0063802 A1 Feb. 22, 2024

Related U.S. Application Data

(63) Continuation of application No. PCT/CN2022/123835, filed on Oct. 8, 2022.

(30) Foreign Application Priority Data

Aug. 22, 2022 (CN) .......................... 202211006012.6

(51) Int. Cl.
*H03L 7/087* (2006.01)
*H03K 19/21* (2006.01)
*H03L 7/183* (2006.01)

(52) U.S. Cl.
CPC ............. *H03L 7/087* (2013.01); *H03K 19/21* (2013.01); *H03L 7/183* (2013.01)

(58) Field of Classification Search
CPC .......... H03L 7/087; H03L 7/183; H03K 19/21
See application file for complete search history.

(56) References Cited

U.S. PATENT DOCUMENTS 7,821,313 B2 * 10/2010 Yamane ................ H03L 7/0816
327/158
8,829,960 B2 * 9/2014 Na ........................ H03L 7/0816
327/158

(Continued)

FOREIGN PATENT DOCUMENTS

CN 104467819 A 3/2015
CN 106549664 A 3/2017

(Continued)

OTHER PUBLICATIONS

International Search Report in the international application No. PCT/CN2022/123835, mailed on Nov. 29, 2022. 7 Pages with English translation.

*Primary Examiner* — Adam D Houston
(74) *Attorney, Agent, or Firm* — Syncoda LLC; Feng Ma

(57) ABSTRACT

A delay locked loop includes a preprocessing module, a first regulable delay line, a second regulable delay line and a first regulation module. The preprocessing module is configured to receive an initial clock signal, preprocess the initial clock signal, and output a first clock signal and a second clock signal. The first regulable delay line is configured to receive the first clock signal, regulate and transmit the first clock signal, and output a first target clock signal. The second regulable delay line is configured to receive the second clock signal, regulate and transmit the second clock signal, and output a second synchronization clock signal. The first regulation module is configured to regulate delay of the second synchronization clock signal based on the first target clock signal, and output a second target clock signal.

20 Claims, 8 Drawing Sheets

(56) References Cited

U.S. PATENT DOCUMENTS

| | | | | |
|---|---|---|---|---|
| 8,917,128 B1* | 12/2014 | Baek | ............... | G11C 7/222 |
| | | | | 327/158 |
| 9,608,639 B2* | 3/2017 | Choi | ............... | H03L 7/095 |
| 10,367,493 B1* | 7/2019 | Addepalli | ............... | H03L 7/0891 |
| 10,560,105 B1* | 2/2020 | Sun | ............... | H04L 7/0037 |
| 11,791,720 B2* | 10/2023 | Giovannone | ............... | H02M 3/04 |
| | | | | 323/234 |
| 11,881,768 B2* | 1/2024 | Giovannone | ............... | H02M 3/04 |
| 2004/0263226 A1* | 12/2004 | Kim | ............... | H03L 7/0814 |
| | | | | 327/158 |
| 2008/0111595 A1 | 5/2008 | Na | | |
| 2008/0252343 A1* | 10/2008 | Yamane | ............... | H03L 7/0814 |
| | | | | 327/158 |
| 2009/0146708 A1* | 6/2009 | Yun | ............... | H03L 7/07 |
| | | | | 327/158 |
| 2010/0079180 A1* | 4/2010 | Kim | ............... | H03L 7/0818 |
| | | | | 327/158 |
| 2011/0037504 A1* | 2/2011 | Lee | ............... | H03L 7/0818 |
| | | | | 327/158 |
| 2011/0148487 A1 | 6/2011 | Na | | |
| 2013/0028029 A1 | 1/2013 | Huang | | |
| 2017/0085272 A1 | 3/2017 | Shi | | |
| 2017/0230052 A1* | 8/2017 | Jeong | ............... | H03L 7/091 |
| 2019/0089358 A1* | 3/2019 | Mittal | ............... | H03K 5/133 |
| 2021/0305989 A1* | 9/2021 | Han | ............... | H03L 7/07 |
| 2023/0353146 A1* | 11/2023 | Li | ............... | H03K 5/1565 |
| 2024/0056083 A1* | 2/2024 | Li | ............... | H03K 3/86 |
| 2024/0063802 A1* | 2/2024 | Li | ............... | H03L 7/183 |
| 2024/0106439 A1* | 3/2024 | Li | ............... | H03L 7/0814 |

FOREIGN PATENT DOCUMENTS

| | | |
|---|---|---|
| CN | 107872221 A | 4/2018 |
| CN | 115065359 A | 9/2022 |
| KR | 101262322 B1 * | 5/2013 |
| KR | 20150063242 A * | 6/2015 |

* cited by examiner

DELAY LOCKED LOOP AND MEMORY

CROSS-REFERENCE TO RELATED APPLICATIONS

This is a continuation of International Patent Application No. PCT/CN2022/123835 filed on Oct. 8, 2022, which claims priority to Chinese Patent application No. 202211006012.6 filed on Aug. 22, 2022. The disclosures of the above-referenced applications are hereby incorporated by reference in their entirety.

BACKGROUND

In a Dynamic Random Access Memory (DRAM), a delay locked loop (DLL) performs phase synchronization and phase lock on four-phase clock signals (that is, a difference of adjacent two of four phases of the clock signals is 90 degrees sequentially) to obtain a group of target clock signals having a phase difference of 90 degrees, and a data signal DQ is sampled. However, due to mismatches or performance deviations of devices in the DLL, there may be an offset in a phase difference between the generated target clock signals, which reduces data sampling effect.

SUMMARY

The disclosure relates to the technical field of semiconductor memories, and in particular to a delay locked loop (DLL) and a memory, to reduce a phase deviation between target clock signals outputted by the DLL.

Technical solutions of the disclosure are implemented as follows.

A first aspect of an embodiment of the disclosure provides a DLL, including a preprocessing module, a first regulable delay line, a second regulable delay line, and a first regulation module.

The preprocessing module is configured to receive an initial clock signal, preprocess the initial clock signal, and output a first clock signal and a second clock signal.

The first regulable delay line is configured to receive the first clock signal, regulate and transmit the first clock signal, and output a first target clock signal.

The second regulable delay line is configured to receive the second clock signal, regulate and transmit the second clock signal, and output a second synchronization clock signal.

The first regulation module is configured to receive the first target clock signal and the second synchronization clock signal, regulate delay of the second synchronization clock signal based on the first target clock signal, and output a second target clock signal.

Here, a phase difference between the first target clock signal and the second target clock signal is a preset value.

A second aspect of an embodiment of the disclosure provides a memory, including at least delay locked loop. The delay locked loop includes a preprocessing module, a first regulable delay line, a second regulable delay line, and a first regulation module.

The preprocessing module is configured to receive an initial clock signal, preprocess the initial clock signal, and output a first clock signal and a second clock signal.

The first regulable delay line is configured to receive the first clock signal, regulate and transmit the first clock signal, and output a first target clock signal.

The second regulable delay line is configured to receive the second clock signal, regulate and transmit the second clock signal, and output a second synchronization clock signal.

The first regulation module is configured to receive the first target clock signal and the second synchronization clock signal, regulate delay of the second synchronization clock signal based on the first target clock signal, and output a second target clock signal.

A phase difference between the first target clock signal and the second target clock signal is a preset value.

DETAILED DESCRIPTION

Figure 1:
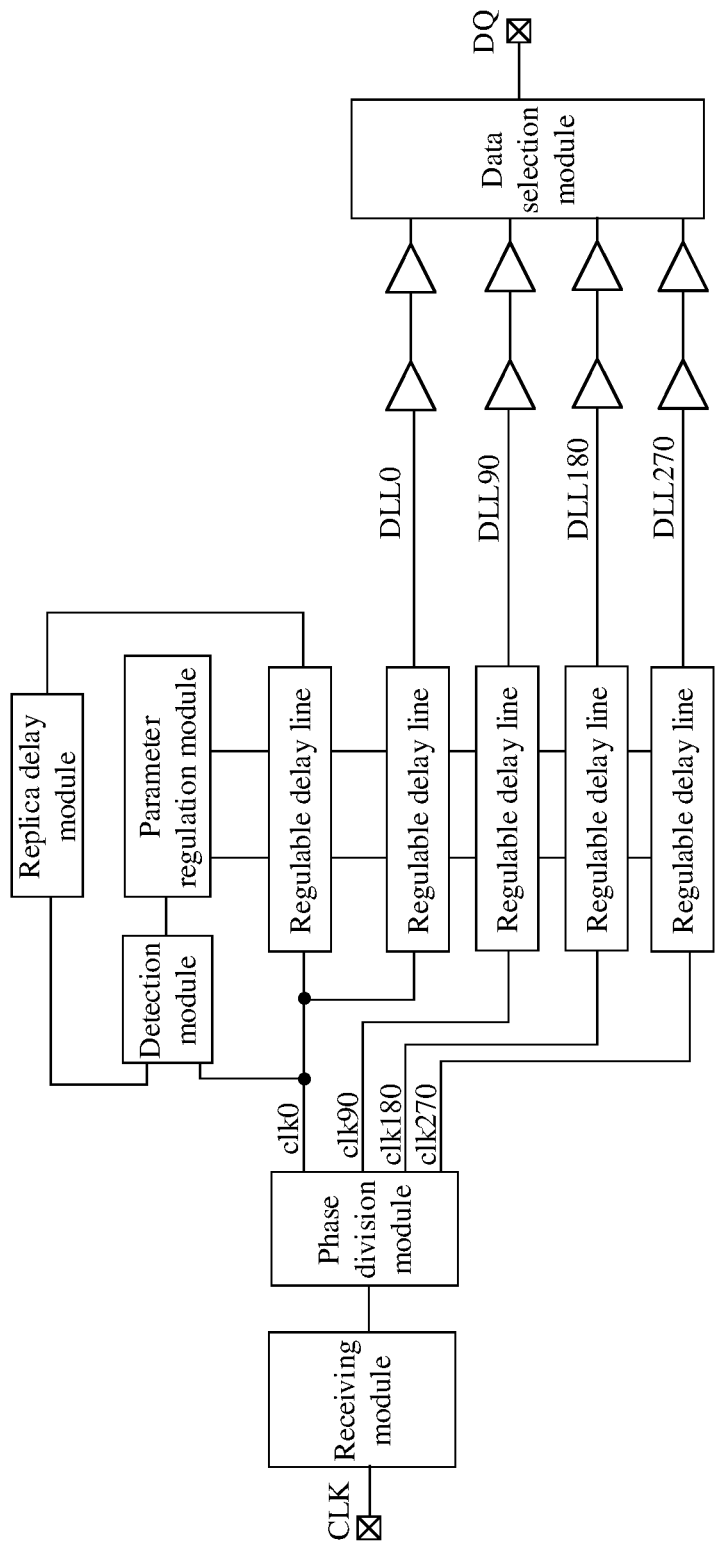
FIG. 1 is a schematic structural diagram of a delay locked loop (DLL).

Technical solutions in the embodiments of the disclosure will be clearly and completely described below with reference to the drawings in the embodiments of the disclosure. It may be understood that specific embodiments described here are only intended to explain relevant disclosures, rather than limiting the disclosures. Furthermore, it should also be noted that only portions related to the relevant disclosures are shown in the drawings, to facilitate descriptions. Unless otherwise defined, all technical and scientific terms used here have the same meanings as those usually understood by technicians of the technical field to which the disclosure belongs. The terms used here are only intended to describe the embodiments of the disclosure, and are not intended to limit the disclosure. In the following descriptions, reference is made to "some embodiments" which describe a subset of all possible embodiments, however, it may be understood that "some embodiments" may be the same subset or different subsets of all possible embodiments, and may be combined with each other without conflict. It should be noted that terms "first\second\third" involved in the embodiments of the disclosure are only intended to distinguish similar objects and do not represent a particular order of the objects, and it may be understood that "first\second\third" may be interchanged in a particular order or sequence if allowable, so that the embodiments of the disclosure described here may be implemented in an order other than that illustrated or described here.

DRAM: Dynamic Random Access Memory

SDRAM: Synchronous Dynamic Random Access Memory

DDR: Double Data Rate SDRAM

LPDDR: Low Power DDR

DDRn: DDRn Specification, such as DDR3, DDR4, DDR5, DDR6

LPDDRn: LPDDRn Specification, such as LPDDR3, LPDDR4, LPDDR5, LPDDR6

At present, a speed of memories gets high gradually. For example, due to speed improvement and process limitations, a high-speed clock signal at an interface of the DDR5 is internally converted to a low-speed clock signal. For example, a delay locked loop (DLL) in the memory dynamically regulates delay of the clock signal and perform delay matching by a large number of inverter chains. In a high frequency speed, these inverter chains may result in a significant accumulation of signal jitters, and finally result in signal loss. Therefore, an initial clock signal CLK from the outside may be subjected to frequency/phase division internally in the high frequency speed of DDR5, to obtain 4-phase clock signals, for ensuring signal quality. The 4-phase clock signals are sent to the DLL respectively, for phase synchronization and phase locking. Then, a data signal DQ is sampled, selected and outputted by a data selection module (Mux) using the regulated 4-phase clock signals, to obtain a target data signal.

Figure 2:
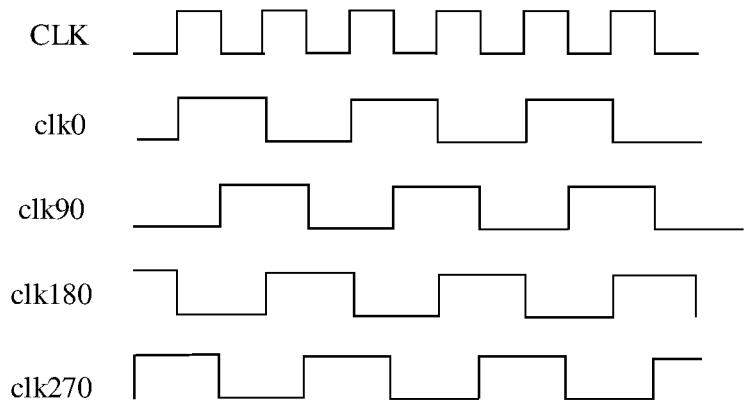
FIG. 2 is a first schematic timing diagram of signals.

FIG. 1 is a schematic structural diagram of a DLL. FIG. 2 is a first schematic timing diagram of signals. As shown in FIG. 1 and FIG. 2, an initial clock signal CLK is inputted to the DLL through a receiving module, and then is processed by a phase division module into 4-phase clock signals (i.e., clk0, clk90, clk180 and clk270). Frequencies of the 4-phase clock signals are reduced to half of a frequency of the initial clock signal CLK. Four regulable delay lines delay the 4-phase clock signals and regulate duty cycles thereof respectively. In this way, after the DLL performs phase locking, 4-phase target clock signals (i.e., DLL0, DLL90, DLL180 and DLL270) are obtained, and the target clock signals DLL0, DLL90, DLL180 and DLL270 are transmitted to a data selection module through signal transmission paths corresponding to the target clock signals. The data selection module converts the 4-phase target clock signals DLL0, DLL90, DLL180 and DLL270 into a data sampling clock signal DQS. Subsequently, a data signal DQ is sampled by using the data sampling clock signal DQS, to obtain a target data signal. Furthermore, the DLL further includes a fifth regulable delay line, a replica delay module, a detection module, and a parameter regulation module. The fifth regulable delay line and the replica delay module constitute a loop, the fifth regulable delay line receives the clock signal clk0, and the replica delay module outputs an analog clock signal which simulates a waveform of the target clock signal DLL0 transmitted to the data selection module. The detection module detects a phase difference between the analog clock signal and the clock signal clk0. The parameter regulation module outputs, according to the detection result of the detection module, a delay line control signal which is used to control operation parameters of all regulable delay lines. In this way, the DLL has a closed-loop feedback mechanism, to ensure that the processed target clock signals DLL0/DLL90/DLL180/DLL270 meets requirements.

Figure 3:
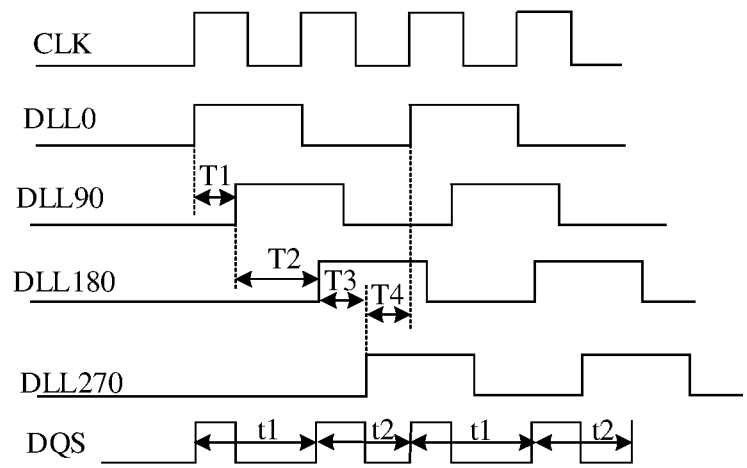
FIG. 3 is a second schematic timing diagram of signals.

It may be known from the above descriptions that the initial clock signal CLK is divided into four branches inputted into the DLL. In order to ensure that rising and falling edge information of the initial clock signal CLK are not lost, four regulable delay lines are prepared inside the DLL, to perform phase synchronization and locking on the 4-phase clock signals, and transmit them to the data selection module (Mux). However, due to mismatches of the four regulable delay lines and certain errors present in the 4-phase clock signals (clk0, clk90, clk180 and clk270) outputted by the conversion module, phase deviations are also present between the target clock signals DLL0/DLL90/DLL180/DLL270. FIG. 3 shows a second schematic timing diagram of signals. As shown in FIG. 3, phase deviations (denoted by T1, T2, T3 and T4) between any two of the target clock signals DLL0/DLL90/DLL180/DLL270 sent to the data selection module are not the same, and at this point, lengths of pulse periods (denoted by t1, t2) in the data sampling clock signal DQS are not the same, that is, an effective window of the data sampling clock signal is small, which limits improvement of performance of the memory.

On the above basis, the embodiments of the disclosure provide a delay locked loop (DLL) to improve phase deviations between clock signals outputted by the DLL, to further improve performance of the memory.

The embodiments of the disclosure will be described in detail below with reference to the drawings.

Figure 4:
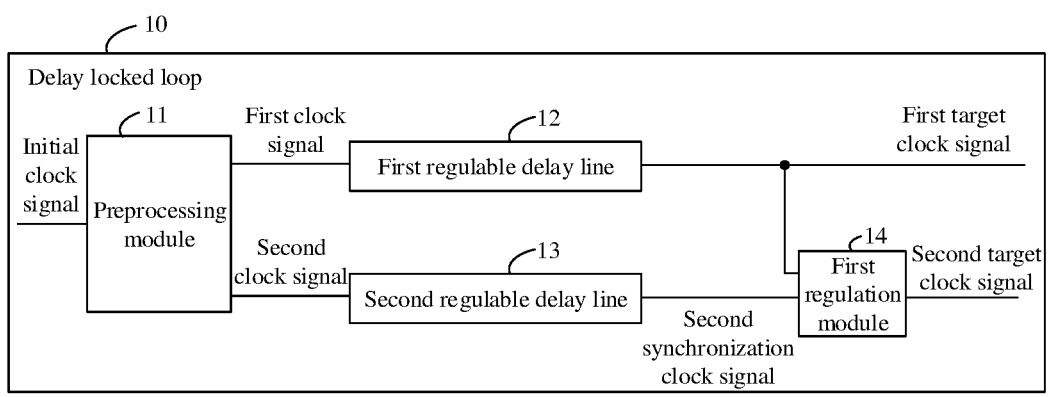
FIG. 4 is a first schematic structural diagram of a DLL according to an embodiment of the disclosure.

In an embodiment of the disclosure, FIG. 4 shows a first schematic structural diagram of a delay locked loop (DLL) 10 according to an embodiment of the disclosure. As shown in FIG. 4, the DLL 10 includes a preprocessing module 11, a first regulable delay line 12, a second regulable delay line 13, and a first regulation module 14.

The preprocessing module 11 is configured to receive an initial clock signal, preprocess the initial clock signal, and output a first clock signal and a second clock signal.

The first regulable delay line 12 is configured to receive the first clock signal, regulate and transmit the first clock signal, and output a first target clock signal.

The second regulable delay line 13 is configured to receive the second clock signal, regulate and transmit the second clock signal, and output a second synchronization clock signal.

The first regulation module 14 is configured to receive the first target clock signal and the second synchronization clock signal, regulate delay of the second synchronization clock signal based on the first target clock signal, and output a second target clock signal. A phase difference between the first target clock signal and the second target clock signal is a preset value.

It should be noted that the DLL 10 of the embodiment of the disclosure may be applied to, but is not limited to be applied to a memory, such as DRAM, SDRAM, or the like. Furthermore, in other analog/digital circuits, a set of clock signals with different phases may be generated by the DLL 10 provided in the embodiment of the disclosure.

In the DLL 10, the first target clock signal and the second synchronization clock signal are obtained by the first regulable delay line 12 and the second regulable delay line 13 respectively. Then, the delay of the second synchronization clock signal is regulated by the first regulation module 14, to obtain the second target clock signal, which ensures that the phase difference between the first target clock signal and the second target clock signal is the preset value. In this way, the phase difference between the first target clock signal and the second synchronization clock signal may be corrected by the first regulation module 14, thereby improving phase deviations caused by mismatches of the delay lines or the preprocessing process.

It should be noted that the preset value may be set according to an actual application scenario, such as 180 degrees, 90 degrees. Furthermore, a certain error in the phase difference is allowed in the embodiment of the disclosure, that is, the phase difference between the first target clock signal and the second target clock signal is the preset value within an allowable error range. Unless otherwise specified, subsequent definitions on the phase difference and clock cycles may be understood accordingly.

The preset value is 90 degrees for illustrating the embodiment of the disclosure subsequently. In this case, the first target clock signal may be represented as DLL0, and the second target clock signal may be represented as DLL90. Similar reference is made to understand other situations.

Figure 5:
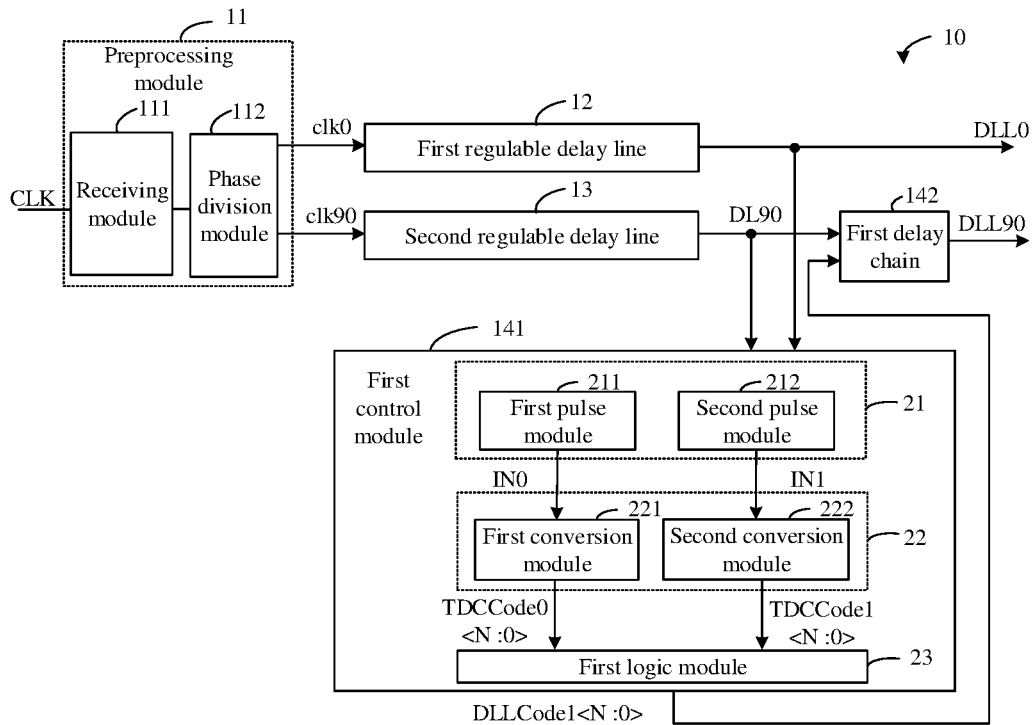
FIG. 5 is a second schematic structural diagram of a DLL according to an embodiment of the disclosure.

In some embodiments, FIG. 5 shows a second schematic structural diagram of a DLL 10 according to an embodiment of the disclosure. As shown in FIG. 5, the preprocessing module 11 includes a receiving module 111 and a phase division module 112.

The receiving module 111 is configured to receive the initial clock signal CLK, and output a to-be-processed clock signal. A clock cycle of the to-be-processed clock signal is the same as a clock cycle of the initial clock signal CLK.

The phase division module 112 is configured to receive the to-be-processed clock signal, perform frequency division and phase division on the to-be-processed clock signal, and output the first clock signal clk0 and the second clock signal clk90. A clock cycle of the first clock signal clk0 is the same as a clock cycle of the second clock signal clk90, and the clock cycle of the first clock signal clk0 is twice the clock cycle of the initial clock signal CLK.

It should be noted that in an ideal situation, a phase difference between the first clock signal clk0 and the second clock signal clk90 is 90 degrees. However, due to a deviation and mismatch in actual process parameters, deviations may be present in operation parameters of the phase division module 112, resulting in that the phase difference between the first clock signal clk0 and the second clock signal clk90 is not 90 degrees and exceeds the allowable error range. This is also a part of reasons why the first regulation module 14 is introduced.

In some embodiments, with reference to FIG. 4 and FIG. 5, the first regulation module 14 includes a first control module 141 and a first delay chain 142.

The first control module 141 is configured to receive the first target clock signal DLL0 and the second synchronization clock signal DL90, and output a first control code DLLCode1<N: 0> based on a phase difference between the first target clock signal DLL0 and the second synchronization clock signal DL90.

The first delay chain 142 includes multiple first delay units, and is configured to receive the first control code DLLCode1<N: 0> and the second synchronization clock signal DL90, regulate a delay of the second synchronization clock signal DL90 by using multiple first delay units based on the first control code DLLCode1<N: 0>, and output the second target clock signal DLL90.

It should be noted that the first control code DLLCode1<N: 0> is obtained by conversion according to a phase deviation of the second synchronization clock signal DL90 relative to an ideal situation (that is, 90 degrees is delayed relative to the first target clock signal DLL0). Furthermore, the first delay chain 142 may regulate a phase of the second synchronization clock signal DL90 to be forward or backward based on the first control code DLLCode1<N: 0>, and obtain the second target clock signal DLL90, to ensure that the phase difference between the first target clock signal DLL0 and the second target clock signal DLL90 is 90 degrees.

In some embodiments, as shown in FIG. 5, the first control module 141 include a first pulse processing module 21, a first time-to-digital conversion module 22, and a first logic module 23.

The first pulse processing module 21 is configured to receive the first target clock signal DLL0 and the second synchronization clock signal DL90, and output a first pulse signal IN0 and a second pulse signal IN1. Each of the first pulse signal IN0 and the second pulse signal IN1 includes one pulse, a pulse width of the first pulse signal IN0 indicates the phase difference between the first target clock signal DLL0 and the second synchronization clock signal DL90, and a pulse width of the second pulse signal IN1 indicates a phase difference between an inverted signal of the first target clock signal and the second synchronization clock signal DL90.

The first time-to-digital conversion module 22 is configured to receive the first pulse signal IN0 and the second pulse signal IN1, convert the first pulse signal IN0 and output a first conversion code TDCCode0<N: 0>, and convert the second pulse signal IN1 and output a second conversion code TDCCode1<N: 0>. The first conversion code TDCCode0<N: 0> characterizes a width of the first pulse signal IN0, and the second conversion code TDCCode1<N: 0> characterizes a width of the second pulse signal IN1.

The first logic module 23 is configured to receive the first conversion code TDCCode0<N: 0> and the second conversion code TDCCode1<N: 0>, perform a subtraction operation on the second conversion code TDCCode1<N: 0> and the first conversion code TDCCode0<N: 0>, and output the first control code DLLCode1<N: 0>.

In this way, in response to the pulse width of the first pulse signal IN0 being greater than that of the second pulse signal IN1, the second synchronization clock signal DL90 is lagged. In response to the pulse width of the first pulse signal IN0 being less than that of the second pulse signal IN1, the second synchronization clock signal DL90 is advanced. Furthermore, a value of the first conversion code TDCCode0<N: 0> corresponds to the pulse width of the first pulse signal IN0, and a value of the second conversion code TDCCode1<N: 0> corresponds to the pulse width of the second pulse signal IN1. Therefore, the first control code DLLCode1<N: 0> may be obtained by subtracting the first conversion code TDCCode0<N: 0> from the second conversion code TDCCode1<N: 0>.

In particular, according to definitions of various parameters in the circuit and different signal connection relationships, the first control code DLLCode1<N: 0> may also be obtained by subtracting the second conversion code TDCCode1<N: 0> from the first conversion code TDCCode0<N: 0>, and specific mechanism is determined according to an actual circuit.

Figure 6:
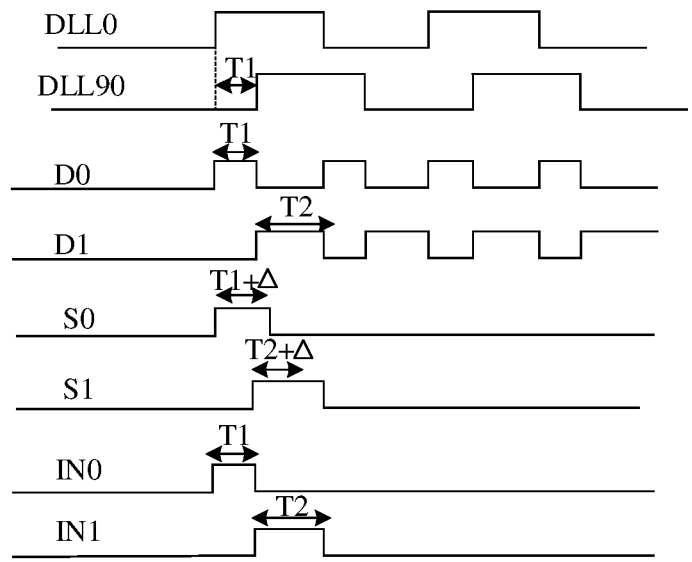
FIG. 6 is a first schematic timing diagram of signals according to an embodiment of the disclosure.

In some embodiments, FIG. 6 shows a first schematic timing diagram of signals according to an embodiment of the disclosure. With reference to FIG. 5 and FIG. 6, the first pulse processing module 21 include a first pulse module 211 and a second pulse module 212.

The first pulse module 211 is configured to receive the first target clock signal DLL0 and the second synchronization clock signal DL90, perform an XOR operation on the first target clock signal DLL0 and the second synchronization clock signal DL90 and obtain a first detection signal D0, perform pulse interception and broadening on the first detection signal D0 and obtain a first intermediate signal S0, and perform an AND operation on the first intermediate signal S0 and the first detection signal D0 and output the first pulse signal IN0. The first detection signal D0 includes multiple pulses, a pulse width of the first detection signal D0 indicates the phase difference between the first target clock signal DLL0 and the second synchronization clock signal DL90, the first intermediate signal S0 includes one pulse, and a pulse width of the first intermediate signal S0 is greater than the pulse width of the first detection signal D0.

The second pulse module 212 is configured to receive the inverted signal of the first target clock signal and the second synchronization clock signal DL90, perform an XOR operation on the inverted signal of the first target clock signal and the second synchronization clock signal DL90 and obtain a second detection signal D1, perform pulse interception and broadening on the second detection signal D1 and obtain a second intermediate signal S1, and perform an AND operation on the second intermediate signal S1 and the second detection signal D1 and output the second pulse signal IN1. The second detection signal D1 includes multiple pulses, a pulse width of the second detection signal D1 indicates the phase difference between the inverted signal of the first target clock signal and the second synchronization clock signal DL90, the second intermediate signal S1 includes one pulse, and a pulse width of the second intermediate signal S1 is greater than the pulse width of the second detection signal D1.

Here, the pulse of the first intermediate signal S0 covers at least one complete pulse in the first detection signal D0, and the pulse of the second intermediate signal S1 covers at least one complete pulse in the second detection signal D1. In FIG. 6, "Δ" represents a broadening amount in the broadening process.

It should be noted that a structure of the first pulse module 211 and the second pulse module 212 may be formed by a combination of various electrical devices, and a specific example thereof will be provided subsequently in the embodiments of the disclosure.

In some embodiments, with reference to FIG. 5 and FIG. 6, the first time-to-digital conversion module 22 includes a first conversion module 221 and a second conversion module 222.

The first conversion module 221 is configured to receive the first pulse signal IN0, perform sampling and delay by using the first pulse signal IN0 to obtain multiple first sampling clock signals, sample the first pulse signal IN0 by using multiple first sampling clock signals, and output the first conversion code TDCCode0<N: 0>.

The second conversion module 222 is configured to receive the second pulse signal IN1, perform sampling and delay by using the second pulse signal IN1 to obtain multiple second sampling clock signals, sample the second pulse signal IN1 by using multiple second sampling clock signals, and output the second conversion code TDCCode1<N: 0>.

It should be noted that a structure of the first conversion module 221 is similar to that of the second conversion module 222, and the structure may be formed by a combination of various electrical devices, and a specific example thereof will be provided subsequently in the embodiments of the disclosure.

Figure 7:
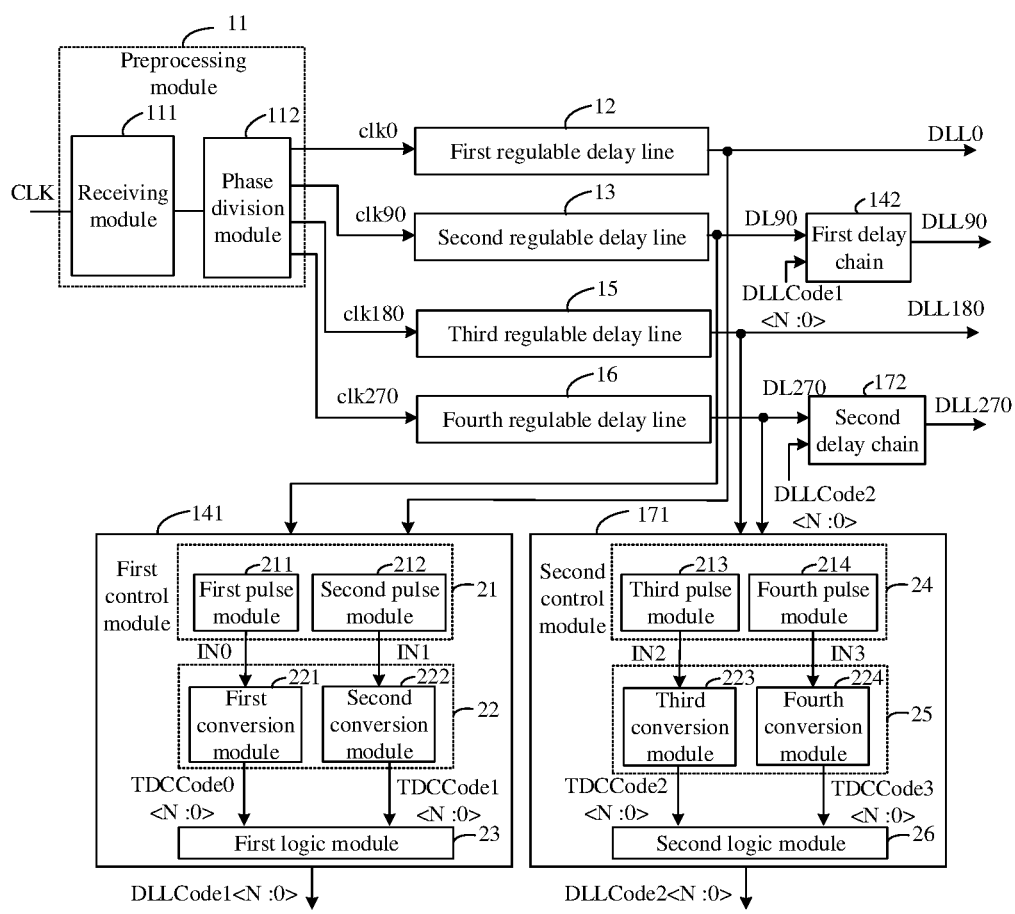
FIG. 7 is a third schematic structural diagram of a DLL according to an embodiment of the disclosure.

In some embodiments, FIG. 7 shows a third schematic structural diagram of a DLL 10 according to an embodiment of the disclosure. As shown in FIG. 7, the output signal of the DLL 10 may further include a third target clock signal DLL180 and a fourth target clock signal DLL270. That is, the DLL 10 outputs the first target clock signal DLL0, the second target clock signal DLL90, the third target clock signal DLL180 and the fourth target clock signal DLL270, and a phase difference between adjacent target clock signals is 90 degrees.

In this case, the preprocessing module 11 is configured to preprocess the initial clock signal CLK, and output the first clock signal clk0, the second clock signal clk90, a third clock signal clk180 and a fourth clock signal clk270. Correspondingly, the DLL 10 further includes a third regulable delay line 15, a fourth regulable delay line 16, and a second regulation module 17.

The third regulable delay line 15 is configured to receive the third clock signal clk180, regulate and transmit the third clock signal clk180, and output a third target clock signal DLL180. A phase difference between the first target clock signal DLL0 and the third target clock signal DLL180 is 180 degrees.

The fourth regulable delay line 16 is configured to receive the fourth clock signal clk270, regulate and transmit the fourth clock signal clk270, and output a fourth synchronization clock signal DL270.

The second regulation module 17 is configured to receive the third target clock signal DLL180 and the fourth synchronization clock signal DL270, regulate delay of the fourth synchronization clock signal DL270 based on the third target clock signal DLL180, and output a fourth target clock signal DLL270.

It should be noted that due to circuit principles of the DLL 10, a mismatch between the first target clock signal DLL0 outputted by the first regulable delay line 12 and the third target clock signal DLL180 outputted by the third regulable delay line 15 is small, as shown in the above FIG. 3. That is, it may be considered that the phase difference between the first target clock signal DLL0 and the third target clock signal DLL180 is stable at 180 degrees, that is, the first target clock signal DLL0 and the third target clock signal DLL180 are inverted to each other. However, the phase of the fourth synchronization clock signal DL270 directly output by the fourth regulable delay line 16 may deviate due to mismatches or other reasons. Therefore, the second regulation module 17 is configured to regulate the delay of the fourth synchronization clock signal DL270, which enables the phase difference between the third target clock signal DLL180 and the fourth target clock signal DLL270 to be 90 degrees, thereby improving phase deviations due to mismatches of the delay lines or the preprocessing process.

It should also be noted that as shown in FIG. 7, the phase division module 112 is further configured to perform frequency division and phase division on the to-be-processed clock signal, and output the first clock signal clk0, the second clock signal clk90, the third clock signal clk180 and the fourth clock signal clk270. Here, the first clock signal clk0, the second clock signal clk90, the third clock signal clk180 and the fourth clock signal clk270 have the same clock cycle, and the clock cycle of the first clock signal clk0 is twice the clock cycle of the initial clock signal CLK.

It should be understood that composition of the second regulation module 17 is similar to that of the first regulation module 14, and a specific description thereof is given below.

In some embodiments, as shown in FIG. 7, the second regulation module 17 includes a second control module 171 and a second delay chain 172.

The second control module 171 is configured to receive the third target clock signal DLL180 and the fourth synchronization clock signal DL270, and output a second control code DLLCode2<N: 0> based on a phase difference between the third target clock signal DLL180 and the fourth synchronization clock signal DL270.

The second delay chain 172 includes multiple second delay units, and is configured to receive the second control code DLLCode2<N: 0> and the fourth synchronization clock signal DL270, regulate the delay of the fourth synchronization clock signal DL270 by using multiple second delay units based on the second control code DLLCode2<N: 0>, and output the fourth target clock signal DLL270.

It should be noted that the second control code DLLCode2<N: 0> is obtained by conversion according to a phase deviation of the fourth synchronization clock signal DL270 relative to an ideal situation (that is, the third target clock signal DLL180 is delayed by 90 degrees). Furthermore, the second delay chain 172 may regulate a phase of the fourth synchronization clock signal DL270 to be forward or backward based on the second control code DLLCode2<N: 0>, and obtain the fourth target clock signal DLL270, to ensure that the phase difference between the third target clock signal DLL180 and the fourth target clock signal DLL270 is 90 degrees.

Figure 8:
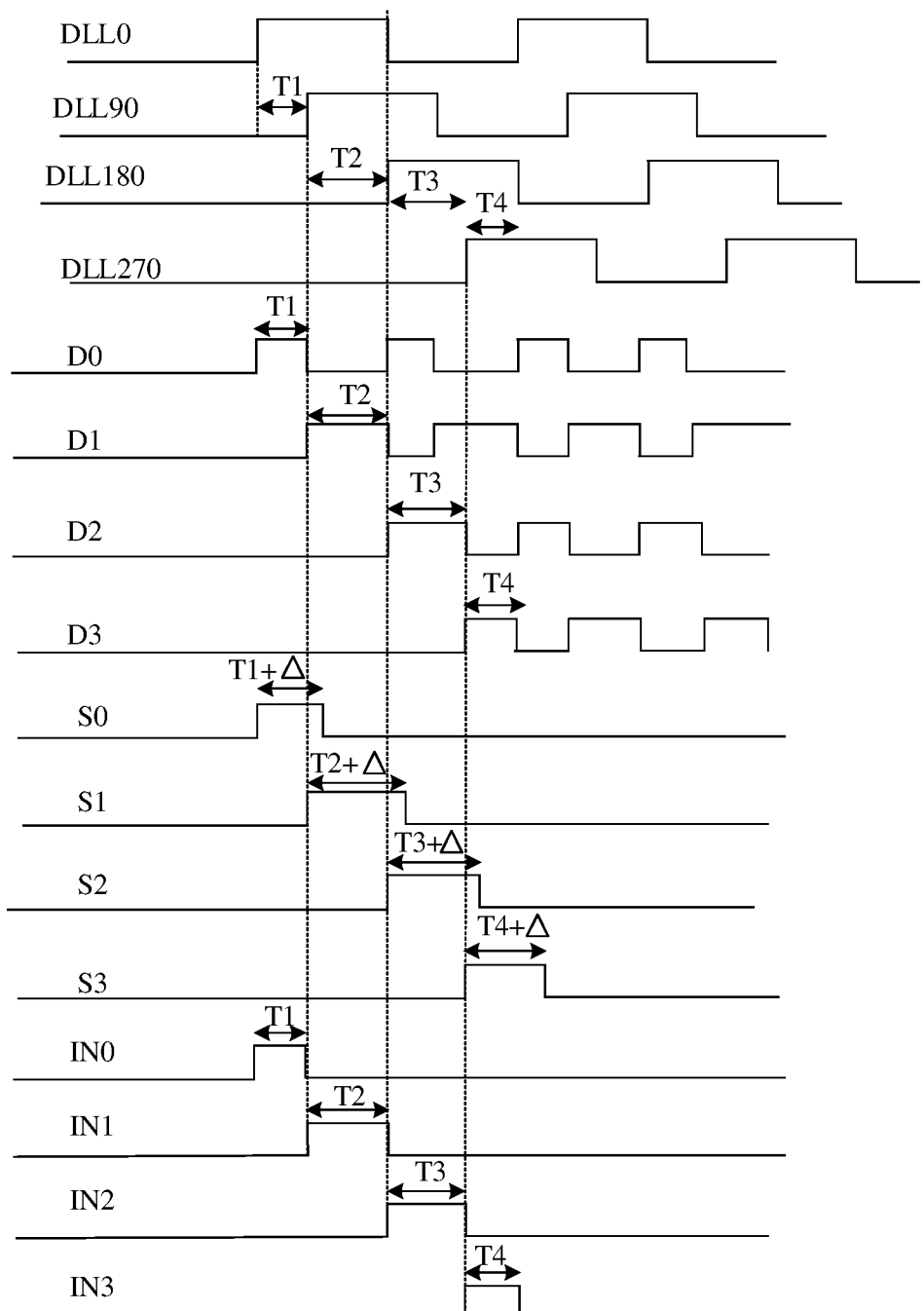
FIG. 8 is a second schematic timing diagram of signals according to an embodiment of the disclosure.

In some embodiments, FIG. 8 shows a second schematic timing diagram of signals according to an embodiment of the disclosure. With reference to FIG. 7 and FIG. 8, the second control module 171 includes a second pulse processing module 24, a second time-to-digital conversion module 25, and a second logic module 26.

The second pulse processing module 24 is configured to receive the third target clock signal DLL180 and the fourth synchronization clock signal DL270, and output a third pulse signal IN2 and a fourth pulse signal IN3. Each of the third pulse signal IN2 and the fourth pulse signal IN3 includes one pulse, a pulse width of the third pulse signal N2 indicates the phase difference between the third target clock signal DLL180 and the fourth synchronization clock signal DL270, and a pulse width of the fourth pulse signal IN3 indicates a phase difference between an inverted signal of the third target clock signal and the fourth synchronization clock signal DL270.

The second time-digital conversion module 25 is configured to receive the third pulse signal IN2 and the fourth pulse signal IN3, convert the third pulse signal IN2 and output a third conversion code TDCCode2<N: 0>, and convert the fourth pulse signal IN3 and output a fourth conversion code TDCCode3<N: 0>. The third conversion code TDCCode2<N: 0> characterizes a width of the third pulse signal IN2, and the fourth conversion code TDCCode3<N: 0> characterizes a width of the fourth pulse signal IN3.

The second logic module 26 is configured to receive the third conversion code TDCCode2<N: 0> and the fourth conversion code TDCCode3<N: 0>, perform a subtraction operation on the fourth conversion code TDCCode3<N: 0> and the third conversion code TDCCode2<N: 0>, and output the second control code DLLCode2<N: 0>.

In this way, when the pulse width of the third pulse signal IN2 is greater than that of the fourth pulse signal IN3, the fourth synchronization clock signal DL270 is lagged. When the pulse width of the third pulse signal IN2 is less than that of the fourth pulse signal IN3, the fourth synchronization clock signal DL270 is advanced. Furthermore, a value of the third conversion code TDCCode2<N: 0> corresponds to the pulse width of the third pulse signal IN2, and a value of the fourth conversion code TDCCode3<N: 0> corresponds to the pulse width of the fourth pulse signal IN3. Therefore, the second control code DLLCode2<N: 0> may be obtained by subtracting the third conversion code TDCCode2<N: 0> from the fourth conversion code TDCCode3<N: 0>.

In some embodiments, as shown in FIG. 7, the second pulse processing module 24 includes a third pulse module 213 and a fourth pulse module 214.

The third pulse module 213 is configured to receive the third target clock signal DLL180 and the fourth synchronization clock signal DL270, perform the XOR operation on the third target clock signal DLL180 and the fourth synchronization clock signal DL270 and obtain a third detection signal D2, perform pulse interception and broadening on the third detection signal D2 and obtain a third intermediate signal S2, and perform the AND operation on the third intermediate signal S2 and the third detection signal D2 and output the third pulse signal IN2. The third detection signal D2 includes multiple pulses, a pulse width of the third detection signal D2 indicates the phase difference between the third target clock signal DLL180 and the fourth synchronization clock signal DL270, the third intermediate signal S2 includes one pulse, and a pulse width of the third intermediate signal S2 is greater than the pulse width of the third detection signal D2.

The fourth pulse module 214 is configured to receive the inverted signal of the third target clock signal and the fourth synchronization clock signal DL270, perform the XOR operation on the inverted signal of the third target clock signal and the fourth synchronization clock signal DL270 and obtain a fourth detection signal D3, perform pulse interception and broadening on the fourth detection signal D3 and obtain a fourth intermediate signal S3, and perform the AND operation on the fourth intermediate signal S3 and the fourth detection signal D3 and output the fourth pulse signal IN3. The fourth detection signal D3 includes multiple pulses, and a pulse width of the fourth detection signal D3 indicates the phase difference between the inverted signal of the third target clock signal and the fourth synchronization clock signal DL270. The fourth intermediate signal S3 includes one pulse, and a pulse width of the fourth intermediate signal S3 is greater than the pulse width of the fourth detection signal D3.

Here, the pulse of the third intermediate signal S2 covers at least one complete pulse in the third detection signal D2, and the pulse of the fourth intermediate signal S3 covers at least one complete pulse in the fourth detection signal D3. Furthermore, each of the third pulse module 213 and the fourth pulse module 214 may be formed by a combination of various electrical devices, and a specific example thereof will be provided subsequently in the embodiments of the disclosure.

In some embodiments, as shown in FIG. 7, the second time-to-digital conversion module 25 includes a third conversion module 223 and a fourth conversion module 224.

The third conversion module 223 is configured to receive the third pulse signal IN2, sample and delay the third pulse signal IN2 to obtain multiple third sampling clock signals, sample the third pulse signal IN2 by using multiple third sampling clock signals, and output the third conversion code TDCCode2<N: 0>.

The fourth conversion module 224 is configured to receive the fourth pulse signal IN3, sample and delay the fourth pulse signal IN3 to obtain multiple fourth sampling clock signals, sample the fourth pulse signal IN3 by using multiple fourth sampling clock signals, and output the fourth conversion code TDCCode3<N: 0>.

It should be noted that a structure of the third conversion module is similar to that of the fourth conversion module, and specifically, may be formed by a combination of various electrical devices, and a specific example thereof will be provided subsequently in the embodiments of the disclosure.

It may be seen from the above descriptions that with regard to the DLL 10, the second synchronization clock signal DL90 outputted by the second regulable delay line is additionally regulated by using the first regulation module, and the delay of the fourth synchronization clock signal DL270 outputted by the fourth regulable delay line is regulated by using the second regulation module. Therefore, the phase difference between the obtained 4-phase clock signals is a preset value, thereby improving phase deviations caused by mismatches of the delay lines or the preprocessing process, and improving data sampling effect.

As described previously, a structure of the first pulse module 211 is the same as that of the fourth pulse module 214, and the first conversion module 221 to the fourth conversion module 224 have the same structure. A feasible composition of circuit components is provided by taking the first pulse module 211 and the first conversion module 221 as an example.

Figure 9:
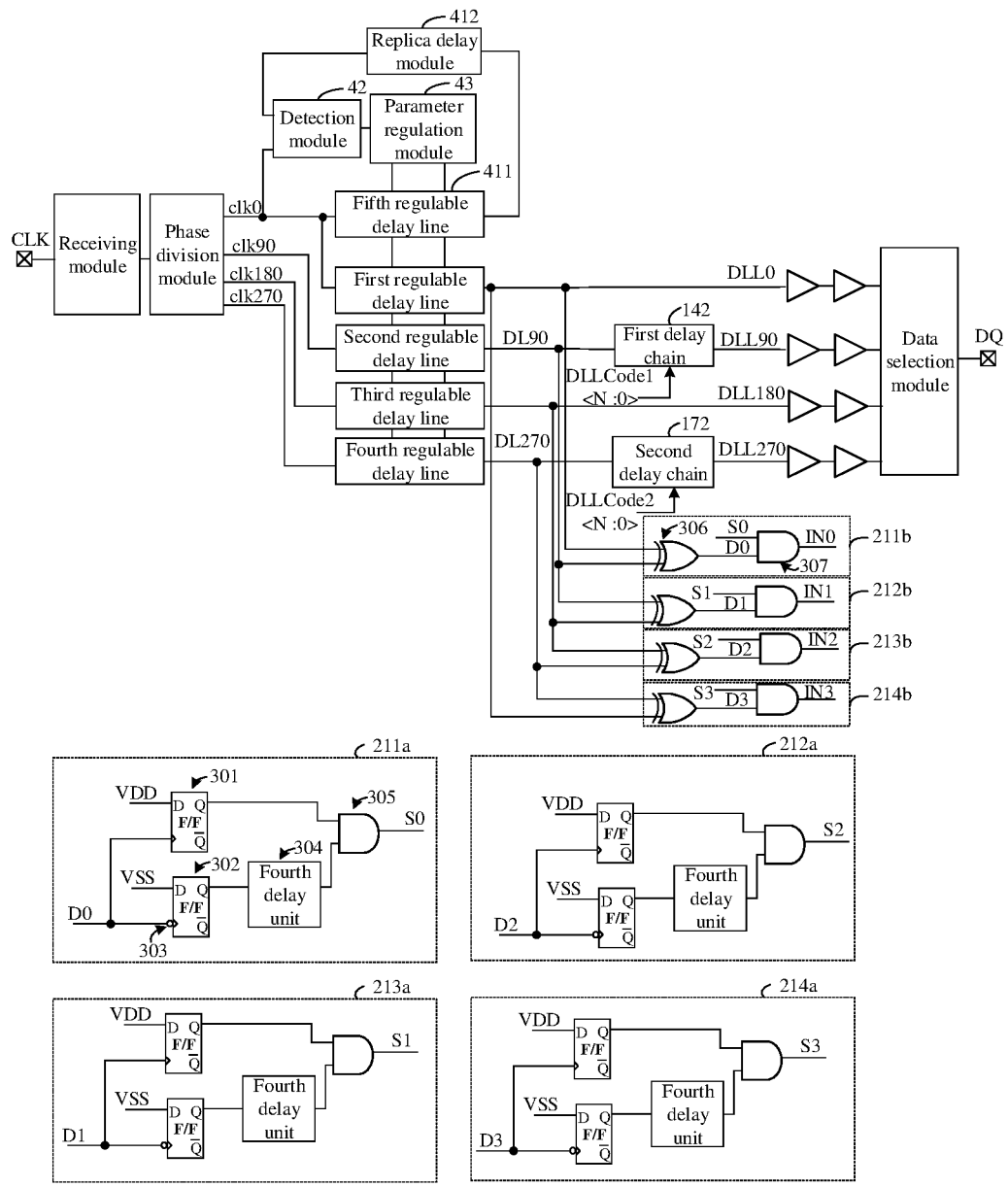
FIG. 9 is a first schematic partial structural diagram of part of a DLL according to an embodiment of the disclosure.

In some embodiments, FIG. 9 shows a first schematic partial structural diagram of a DLL 10 according to an embodiment of the disclosure. As shown in FIG. 9, the first pulse module 211 (including two portions 211a and 211b in the FIG. 9) includes a first trigger 301, a second trigger 302, a first NOT gate 303, a fourth delay unit 304, a first AND gate 305, a first XOR gate 306, and a second AND gate 307. In the first pulse module 211, a first input end of the first XOR gate 306 receives the first target clock signal DLL0, a second input end of the first XOR gate 306 receives the second synchronization clock signal DL90, and an output end of the first XOR gate 306 outputs the first detection signal D0. An input end of the first trigger 301 receives a first power signal VDD, and a clock end of the first trigger 301 is connected to the output end of the first XOR gate 306. An input end of the first NOT gate 303 is connected to the output end of the first XOR gate 306. An input end of the second trigger 302 receives a grounding signal VSS, and an output end of the second trigger 302 is connected to an output end of the first NOT gate 303. An input end of the fourth delay unit 304 is connected to the output end of the second trigger 302. A first input end of the first AND gate 305 is connected to an output end of the first trigger 301, a second input end of the first AND gate 305 is connected to an output end of the fourth delay unit 304, and an output end of the first AND gate 305 outputs the first intermediate signal S0. A first input end of the second AND gate 307 is connected to the output end of the first AND gate 305, a second input end of the second AND gate 307 is connected to the output end of the first XOR gate 306, and an output end of the second AND gate 307 outputs the first pulse signal IN0.

It should be noted that as shown in the above FIG. 8, the first detection signal D0 includes multiple pulses, and a pulse width of each pulse indicates the phase difference between the first target clock signal DLL0 and the second synchronization clock signal DL90; the first intermediate signal S0 includes only one pulse signal, and the pulse width of the first intermediate signal S0 is equal to a sum of the pulse width of the first detection signal D0 and a delay value A of the fourth delay unit 304, while the pulse of the first intermediate signal S0 only covers one pulse of the first detection signal D0. In this way, an AND operation is performed on the first intermediate signal S0 and the first detection signal D0, to retain exactly one pulse of the first detection signal D0, thereby obtaining the first pulse signal IN0 indicating the phase difference between the first target clock signal DLL0 and the second synchronization clock signal DL90.

In order to avoid confusion, only devices in the first pulse module 211 (that is, the portions with a dashed box) are numbered in FIG. 9. Devices in the second pulse module to the fourth pulse module are not numbered, and should be understood correspondingly.

In the second pulse module 212 (including two portions 212a and 212b in the FIG. 9), a first input end of the first XOR gate is the second synchronization clock signal DL90, a second input end of the first XOR gate is the third target clock signal DLL180 (corresponding to the inverted signal of the first target clock signal), an output end of the first XOR gate outputs the second detection signal D1, an output end of the first AND gate outputs the second intermediate signal S1, an output end of the second AND gate outputs the first pulse signal IN0, and connection relationships of other devices are the same as those of the first pulse module 211.

In the third pulse module 213 (including two portions 213a and 213b in the FIG. 9), a first input end of the first XOR gate is the third target clock signal DL180, a second input end of the first XOR gate is the fourth synchronization clock signal DL270, an output end of the first XOR gate outputs the third detection signal D2, an output end of the first AND gate outputs the third intermediate signal S2, an output end of the second AND gate outputs the third pulse signal IN2, and connection relationships of other devices are the same as those of the first pulse module 211.

In the fourth pulse module 214 (including two portions 214a and 214b in the FIG. 9), a first input end of the first XOR gate is the fourth synchronization clock signal DL270, a second input end of the first XOR gate is the first target clock signal DLL0 (corresponding to the inverted signal of the third target clock signal), an output end of the first XOR gate outputs the fourth detection signal D3, an output end of the first AND gate outputs the fourth intermediate signal S3, an output end of the second AND gate outputs the fourth pulse signal IN3, and connection relationships of other devices are the same as those of the first pulse module 211.

In this way, as shown in FIG. 8 and FIG. 9, the first pulse signal IN0, the second pulse signal IN1, the third pulse signal IN2 and the fourth pulse signal IN3 are obtained by the first pulse module 211 to the fourth pulse module 214, and offsets of the second synchronization clock signal DL90 and the fourth synchronization clock signal DL270 are obtained.

In some embodiments, each of the first conversion code TDCCode0<N: 0>, the second conversion code TDCCode1<N: 0>, the third conversion code TDCCode2<N: 0> and the fourth conversion code TDCCode3<N: 0> includes multiple sub-signals. The first conversion code TDCCode0<N: 0> is taken as an example, and includes sub-signals TDCCode0:<0>, TDCCode0:<1>, TDCCode0:<N>.

Figure 10:
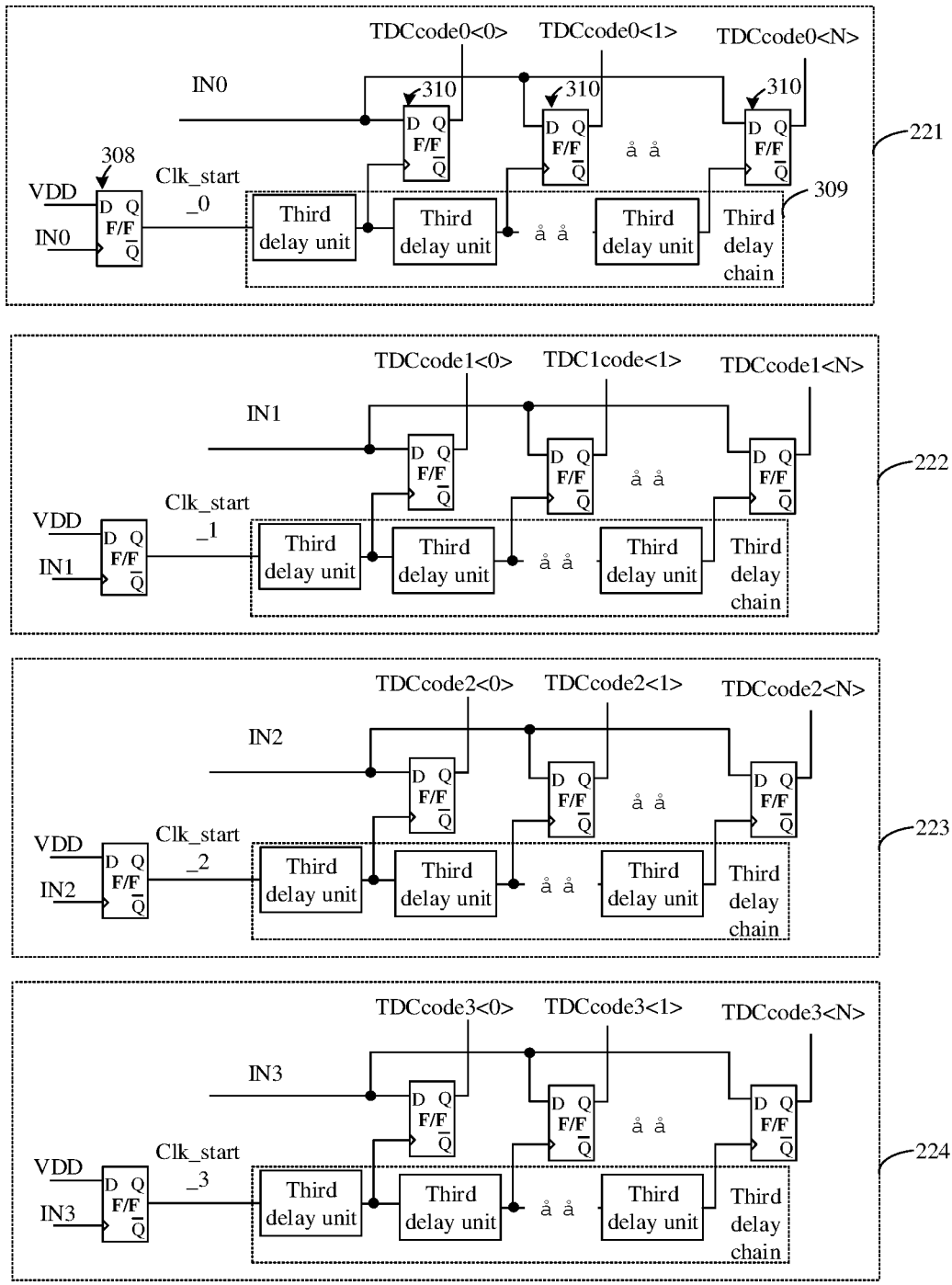
FIG. 10 is a second schematic partial structural diagram of part of a DLL according to an embodiment of the disclosure.

FIG. 10 shows a second schematic partial structural diagram of a DLL 10 according to an embodiment of the disclosure. As shown in FIG. 10, the first conversion module 221 includes a third trigger 308, a third delay chain 309, and multiple fourth triggers 310. An input end of the third trigger 308 receives a second power signal VDD, a clock end of the third trigger 308 receives the first pulse signal IN0, and an output end of the third trigger 308 is connected to an input end of the third delay chain 309; input ends of all of the fourth triggers 310 receive the first pulse signal IN0. The third delay chain 309 includes multiple third delay units arranged in series, a clock end of each of the fourth triggers 310 is correspondingly connected to an output end of a respective one of the third delay units, and an output end of each of the fourth triggers 310 outputs a respective one of the sub-signals of the first conversion code TDCCode0<N: 0>.

Figure 11:
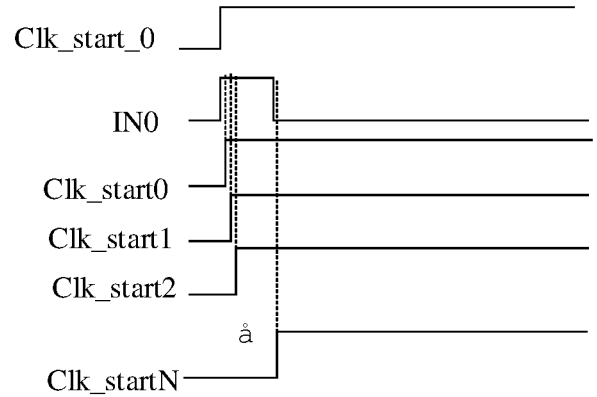
FIG. 11 is a third schematic timing diagram of signals according to an embodiment of the disclosure.

It should be noted that in order to facilitate descriptions, an output signal of the third trigger 308 is denoted as a signal Clk_start_0. FIG. 11 shows a third schematic timing diagram of signals according to an embodiment of the disclosure. As shown in FIG. 11, the signal Clk_start_0 is changed from a low level to a high level at a rising edge of the first pulse signal IN0, and the signal Clk_start_0 passes through multiple third delay units, to sequentially obtain signal Clk_start0 (as the clock signal of a first fourth trigger 310), signal Clk_start1 (as the clock signal of a second fourth trigger 310), . . . , signal Clk_startN (as the clock signal of a last fourth trigger 310). The first pulse signal IN0 is sampled by using the signal Clk_start0 to obtain TDCcode0<0>, the first pulse signal IN0 is sampled by using the signal Clk_start1 to obtain TDCcode0<1>, . . . , the first pulse signal IN0 is sampled by using the signal Clk_startN to obtain TDCcode0<N>, so as to obtain the first conversion code TDCCode0<N: 0>.

Similarly, only devices in the first conversion module 221 are numbered in FIG. 10. Devices in the second conversion module to the fourth conversion module are not numbered, and should be understood correspondingly.

In particular, a clock end of the third trigger and input ends of all of the fourth triggers in the second conversion module 222 receive the second pulse signal IN1, and an output end of each of the fourth triggers outputs a respective one of the sub-signals of the second conversion code TDCCode1<N: 0>. A clock end of the third trigger and input ends of all of the fourth triggers in the third conversion module 223 receive the third pulse signal IN2, and an output end of each of the fourth triggers outputs a respective one of the sub-signals of the third conversion code TDCCode2<N: 0>. A clock end of the third trigger and input ends of all of the fourth triggers in the fourth conversion module 224 receive the fourth pulse signal IN3, and an output end of each of the fourth triggers outputs a respective one of the sub-signals of the fourth conversion code TDCCode3<N: 0>.

In this way, the phase difference between the first target clock signal DLL0 and the second synchronization clock signal DL90 is converted to obtain the first conversion code TDCCode0<N: 0>, the phase difference between the inverted signal of the first target clock signal DLL0 and the second synchronization clock signal DL90 is converted to obtain the second conversion code TDCCode1<N: 0>, the phase difference between the third target clock signal DLL180 and the fourth synchronization clock signal DL270 is converted to obtain the third conversion code TDCCode2<N: 0>, and the phase difference between the inverted signal of the third target clock signal and the fourth synchronization clock signal DL270 is converted to obtain the fourth conversion code TDCCode3<N: 0>.

It should be noted that the first delay chain 142, the second delay chain 172 and the third delay chain 309 have the same structure. That is, the first delay chain 142 includes multiple first delay units arranged in series, and the second delay chain 172 includes multiple second delay units. The first delay units in the first delay chain 142, the second delay units in the second delay chain 172, and the third delay units in the third delay chain 309 are the same correspondingly.

In some embodiments, with regard to the first delay chain 142 and the second delay chain 172, an i-th sub-signal of the first control code DLLCode1<N: 0> is used to control an i-th first delay unit to be in a turn-on or turn-off state, and an i-th sub-signal of the second control code DLLCode2<N: 0> is used to control an i-th second delay unit to be in a turn-on or turn-off state.

The first delay chain 142 is configured to delay the second synchronization clock signal DL90 by using the first delay unit in the turn-on state, and output the second target clock signal DLL90.

The second delay chain 172 is configured to delay the fourth synchronization clock signal DL270 by using the second delay unit in the turn-on state, and output the fourth target clock signal DLL270.

In this way, a delay value of the delay chain may be regulated by decreasing or increasing a number of delay units which are turned on, and the target clock signal outputted by the delay chain may be processed in advance or later.

Alternatively, in some other embodiments, each of first a sub-signals of the first control code DLLCode1<N: 0> is in a first state, and each of last (A-a) sub-signals of the first control code DLLCode1<N: 0> is in a second state. Each of first b sub-signals of the second control code DLLCode2<N: 0> is in a first state, and each of last (B-b) sub-signals of the second control code DLLCode2<N: 0> is in a second state. Each of A, B, a and b is a positive integer, a is less than or equal to A. A is a total number of sub-signals in the first control code, b is less than or equal to B, and B refers to a total number of sub-signals in the second control code. Here, A=B=N+1.

The first delay chain 142 is configured to delay the second synchronization clock signal DL90 by using the first to the a-th first delay units, and determine an output signal of the a-th first delay unit as the second target clock signal DLL90.

The second delay chain 172 is configured to delay the fourth synchronization clock signal DL270 by using the first to the b-th second delay units, and determine an output signal of the b-th second delay unit as the fourth target clock signal DLL270.

The first delay chain 142 is taken as an example, assuming the first control code DLLCode1<N: 0>=110000, an output end of the second one of the first delay units outputs the second target clock signal DLL90, that is, the second target clock signal DLL90 may not pass through the last four second delay units. Assuming DLLCode1<N: 0>=111100, an output end of the fourth one of the second delay units outputs the second target clock signal DLL90, that is, the second target clock signal DLL90 may not pass through the last two second delay units.

In this way, since the first regulation module 14 and the second regulation module 17 are introduced into the DLL 10, thereby improving a phase deviation due to mismatches of the delay lines or the preprocessing process.

In some embodiments, as shown in FIG. 9, the first target clock signal DLL0, the second target clock signal DLL90, the third target clock signal DLL180 and the fourth target clock signal DLL270 are applied to data sampling and processing after passing through corresponding signal transmission paths. Specifically, the first target clock signal DLL0, the second target clock signal DLL90, the third target clock signal DLL180 and the fourth target clock signal DLL270 arrive at the data selection module (Mux) after passing through corresponding signal transmission paths, and the data signal DQ is sampled and selected to output by the data selection module using the 4-phase target clock signals, to obtain the target data signal. Here, a certain number of buffers may be arranged on each signal transmission path, to increase signal driving capability, and the same number of buffers are arranged on the four signal transmission paths.

As shown in FIG. 9, the DLL 10 further includes a feedback module (including a fifth regulable delay line 411 and a replica delay module 412), a detection module 42, and a parameter regulation module 42.

The feedback module is configured to receive the first clock signal clk0 and output an analog clock signal. The analog clock signal simulates a waveform of the first target clock signal DLL0 after the first target clock signal passes through the signal transmission path.

The detection module 42 is configured to receive the first clock signal clk0 and the analog clock signal, perform phase detection on the first clock signal clk0 and the analog clock signal, and obtain a phase detection signal.

The parameter regulation module 43 is configured to receive the phase detection signal, and output a delay line control signal based on the phase detection signal.

The first regulable delay line 12 is configured to receive the delay line control signal, regulate and transmit the first clock signal clk0 based on the delay line control signal, and output the first target clock signal DLL0.

The second regulable delay line 13 is configured to receive the delay line control signal, regulate and transmit the second clock signal clk90 based on the delay line control signal, and output the second synchronization clock signal DL90.

Similarly, the third regulable delay line 15 is configured to receive the delay line control signal, regulate and transmit the third clock signal clk180 based on the delay line control signal, and output the third target clock signal DLL180. The fourth regulable delay line 16 is configured to receive the delay line control signal, regulate and transmit the fourth clock signal clk270 based on the delay line control signal, and output the fourth synchronization clock signal DL270.

It should be noted that the waveform of the first target clock signal DLL0 when the first target clock signal DLL0 reaches the data selection module is consistent with that of the first clock signal clk0. Therefore, a feedback regulation mechanism is required. Specifically, the first clock signal clk0 generates the analog clock signal after passing through the feedback module 151. Since the analog clock signal may simulate the waveform of the first target clock signal DLL0 when the first target clock signal DLL0 reaches the data selection module, the delay line control signal is regulated according to the difference between the analog clock signal and the first clock signal clk0, to regulate the operation parameters of the first regulable delay line.

Furthermore, a waveform of the analog clock signal is not exactly the same as that of the first target clock signal DLL0 after the first target clock signal DLL0 passes through the signal transmission path. In an actual operation scenario, after the memory enters a stable operation state, the analog clock signal may be subjected to frequency division, to reduce an update frequency of regulation signals of the delay lines, thereby avoiding signal jitters induced by signal glitches, and reducing power consumption.

In a specific embodiment, as shown in FIG. 9, the feedback module includes a fifth regulable delay line 411 and a replica delay module 412.

The fifth regulable delay line 411 is configured to receive the first clock signal clk0 and the delay line control signal, regulate and transmit the first clock signal clk0 based on the delay line control signal, and output a replica clock signal. A structure of the fifth regulable delay line is the same as that of the first regulable delay line, and the replica clock signal simulates the waveform of the first target clock signal DLL0.

The replica delay module 412 is configured to receive the replica clock signal, delay the replica clock signal, and output the analog clock signal. The replica delay module is configured to simulate delay of the signal transmission path.

In this way, the fifth regulable delay line 411 replicates processes of the first regulable delay line, and the replica delay module 412 is at least configured to replicate delay of the first target clock signal DLL0 when the first target clock signal DLL0 is transmitted through the signal transmission path, thereby constituting a closed-loop for feedback regulation.

In summary, with regard to the DLL, in order to reduce signal a deviation due to layout mismatch, Process Voltage Temperature (PVT) or the like, firstly, rising edge information of each of the first target clock signal, the second synchronization clock signal, the third target clock signal and the fourth synchronization clock signal is logically processed, the first pulse signal IN0 to the fourth pulse signal IN3 are formed and input into four independent time-digital conversion modules (i.e., the first conversion module to the fourth conversion module) respectively, and the first conversion code TDCcode0<N: 0> to the fourth conversion code TDCcode3<N: 0> are obtained correspondingly. Then, the first conversion code TDCcode0<N: 0> is subtracted from the second conversion code TDCcode1<N: 0> to obtain the first control code DLLCode1<N: 0>, and the third conversion code TDCcode2<N: 0> is subtracted from the fourth conversion code TDCcode3<N: 0> to obtain the second control code DLLCode2<N: 0>. Finally, the delay of the second synchronization clock signal is regulated by using the first control code DLLCode1<N: 0>, the delay of the fourth synchronization clock signal is regulated by using the second control code DLLCode2<N: 0>, and 4-phase target clock signals with small phase deviation there-between are obtained, thereby improving data sampling effect.

Figure 12:
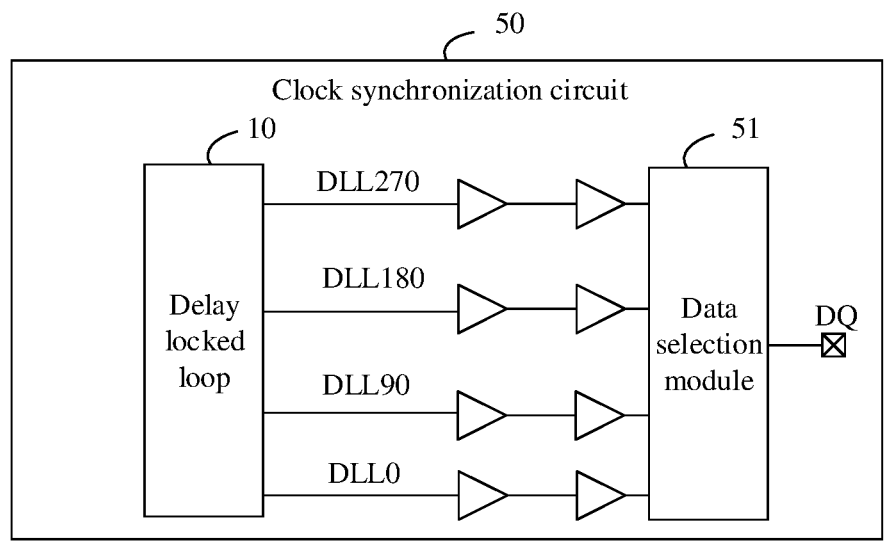
FIG. 12 is a schematic structural diagram of a clock synchronization circuit according to an embodiment of the disclosure.

In another embodiment of the disclosure, FIG. 12 shows a schematic structural diagram of a clock synchronization circuit 50 according to an embodiment of the disclosure. As shown in FIG. 12, the clock synchronization circuit 50 includes the above-mentioned DLL 10 and a data selection module 51, and signal transmission paths are arranged between the DLL 10 and the data selection module 51.

The DLL 10 is configured to receive an initial clock signal, and output a first target clock signal DLL0, a second target clock signal DLL90, a third target clock signal DLL180 and a fourth target clock signal DLL270. Here, a different phase of adjacent two of the first target clock signal DLL0, the second target clock signal DLL90, the third target clock signal DLL180 and the fourth target clock signal DLL270 is 90 degrees.

The data selection module 51 is configured to receive the first target clock signal DLL0, the second target clock signal DLL90, the third target clock signal DLL180 and the fourth target clock signal DLL270 through corresponding signal transmission paths respectively, and sample and select a data signal DQ to be outputted by using the first target clock signal DLL0, the second target clock signal DLL90, the third target clock signal DLL180 and the fourth target clock signal DLL270, to obtain a target data signal to be selected to output.

In particular, as shown in FIG. 12, the same number of buffers are arranged on all of the signal transmission paths, to implement signal delay and drive enhancement. An example that two buffers are arranged on each signal transmission path is taken in FIG. 12 for illustration. However, in an actual application process, more or less buffers may be arranged on each signal transmission path.

It should be noted that reference may be made to the foregoing descriptions regarding to the structure of the DLL 10, in which the first regulation module is arranged on the output side of the second regulable delay line, and the second regulation module is arranged on the output side of the fourth regulable delay line. Then, the delay of the signal outputted by the second regulable delay line is regulated by the first regulation module, and the delay of the signal outputted by the fourth regulable delay line is regulated by the second regulation module. Therefore, it may ensure that the phase difference between the 4-phase clock signals obtained is a preset value, thereby improving a phase deviation caused by mismatches of the delay lines or the preprocessing process, and improving data sampling effect.

Figure 13:
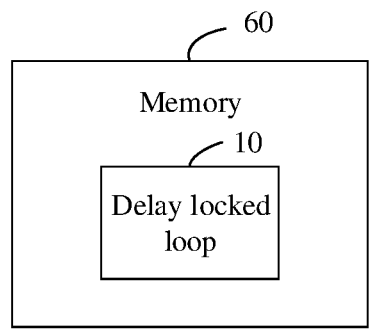
FIG. 13 is a schematic structural diagram of a memory according to an embodiment of the disclosure.

In yet another embodiment of the disclosure, FIG. 13 is a schematic diagram of compositional structures of a memory 60 according to an embodiment of the disclosure. As shown in FIG. 13, the memory 60 includes at least the above-mentioned DLL 10.

In some embodiments, the memory conforms to at least one of the following specifications: DDR3, DDR4, DDR5, DDR6, LPDDR3, LPDDR4, LPDDR5, or LPDDR6.

The above descriptions are only preferred embodiments of the disclosure, and are not intended to limit the scope of protection of the disclosure. It should be noted that in the disclosure, terms "include", "including" or any other variants thereof are intended to cover non-exclusive inclusion, so that a process, method, article or device including a series of elements not only includes those elements, but also includes other elements which are not explicitly listed, or elements inherent to such process, method, article or device. In the absence of more limitations, an element defined by a phrase "includes a . . . " does not preclude existence of other same elements in the process, method, article or device including this element. Numbers of the above embodiments of the disclosure are merely for description, and do not represent advantages and disadvantages of the embodiments. Methods disclosed in the method embodiments provided in the disclosure may be arbitrarily combined without conflict, to obtain a new method embodiment. Features disclosed in the product embodiments provided in the disclosure may be arbitrarily combined without conflict, to obtain a new product embodiment. Features disclosed in the method or device embodiments provided in the disclosure may be arbitrarily combined without conflict, to obtain a new method or device embodiment. The above descriptions are merely specific implementations of the disclosure, however, the scope of protection of the disclosure is not limited thereto. Any variation or replacement apparent to those skilled in the art within the technical scope disclosed by the disclosure shall fall within the scope of protection of the disclosure. Therefore, the scope of protection of the disclosure shall be subjected to the scope of protection of the claims.

The embodiments of the disclosure provide a delay locked loop and a memory. The delay locked loop includes a preprocessing module, a first regulable delay line, a second regulable delay line, and a first regulation module. The preprocessing module is configured to receive an initial clock signal, preprocess the initial clock signal, and output a first clock signal and a second clock signal. The first regulable delay line is configured to receive the first clock signal, regulate and transmit the first clock signal, and output a first target clock signal. The second regulable delay line is configured to receive the second clock signal, regulate and transmit the second clock signal, and output a second synchronization clock signal. The first regulation module is configured to regulate delay of the second synchronization clock signal based on the first target clock signal, and output a second target clock signal. Here, a phase difference between the first target clock signal and the second target clock signal is a preset value. In this way, the phase difference between the first target clock signal and the second synchronization clock signal may be corrected by the first regulation module, improving the phase deviation between target clock signals.

The invention claimed is:

1. A delay locked loop, comprising:
   a preprocessing module configured to receive an initial clock signal, preprocess the initial clock signal, and output a first clock signal and a second clock signal;
   a first regulable delay line configured to receive the first clock signal, regulate and transmit the first clock signal, and output a first target clock signal;
   a second regulable delay line configured to receive the second clock signal, regulate and transmit the second clock signal, and output a second synchronization clock signal; and
   a first regulation module configured to receive the first target clock signal and the second synchronization clock signal, regulate delay of the second synchronization clock signal based on the first target clock signal, and output a second target clock signal,
   wherein a phase difference between the first target clock signal and the second target clock signal is a preset value.

2. The delay locked loop of claim 1, wherein the preprocessing module comprises:
   a receiving module configured to receive the initial clock signal, and output a to-be-processed clock signal, wherein a clock cycle of the to-be-processed clock signal is the same as a clock cycle of the initial clock signal; and
   a phase division module configured to receive the to-be-processed clock signal, perform frequency division and phase division on the to-be-processed clock signal, and output the first clock signal and the second clock signal, wherein a clock cycle of the first clock signal is the same as a clock cycle of the second clock signal, and the clock cycle of the first clock signal is twice the clock cycle of the initial clock signal.

3. The delay locked loop of claim 2, wherein the first regulation module comprises:
   a first control module configured to receive the first target clock signal and the second synchronization clock signal, and output a first control code based on a phase difference between the first target clock signal and the second synchronization clock signal; and
   a first delay chain comprising a plurality of first delay units, and configured to receive the first control code and the second synchronization clock signal, regulate the delay of the second synchronization clock signal by using the plurality of first delay units based on the first control code, and output the second target clock signal.

4. The delay locked loop of claim 3, wherein the first control module comprises:
   a first pulse processing module configured to receive the first target clock signal and the second synchronization clock signal, and output a first pulse signal and a second pulse signal, wherein each of the first pulse signal and the second pulse signal comprises one pulse, a pulse width of the first pulse signal indicates the phase difference between the first target clock signal and the second synchronization clock signal, and a pulse width of the second pulse signal indicates a phase difference between an inverted signal of the first target clock signal and the second synchronization clock signal;

a first time-to-digital conversion module configured to receive the first pulse signal and the second pulse signal, convert the first pulse signal and output a first conversion code, and convert the second pulse signal and output a second conversion code, wherein the first conversion code characterizes a width of the first pulse signal, and the second conversion code characterizes a width of the second pulse signal; and a first logic module configured to receive the first conversion code and the second conversion code, perform a subtraction operation on the second conversion code and the first conversion code, and output the first control code.

5. The delay locked loop of claim 4, wherein the first pulse processing module comprises:

a first pulse module configured to receive the first target clock signal and the second synchronization clock signal, perform an exclusion OR (XOR) operation on the first target clock signal and the second synchronization clock signal and obtain a first detection signal, perform pulse interception and broadening on the first detection signal and obtain a first intermediate signal, and perform an AND operation on the first intermediate signal and the first detection signal and output the first pulse signal, wherein the first detection signal comprises a plurality of pulses, a pulse width of the first detection signal indicates the phase difference between the first target clock signal and the second synchronization clock signal, the first intermediate signal comprises one pulse, and a pulse width of the first intermediate signal is greater than the pulse width of the first detection signal; and a second pulse module configured to receive the inverted signal of the first target clock signal and the second synchronization clock signal, perform an XOR operation on the inverted signal of the first target clock signal and the second synchronization clock signal and obtain a second detection signal, perform pulse interception and broadening on the second detection signal and obtain a second intermediate signal, and perform an AND operation on the second intermediate signal and the second detection signal and output the second pulse signal, wherein the second detection signal comprises a plurality of pulses, a pulse width of the second detection signal indicates the phase difference between the inverted signal of the first target clock signal and the second synchronization clock signal, the second intermediate signal comprises one pulse, and a pulse width of the second intermediate signal is greater than the pulse width of the second detection signal.

6. The delay locked loop of claim 5, wherein the first time-to-digital conversion module comprises:

a first conversion module configured to receive the first pulse signal, perform sampling and delay by using the first pulse signal to obtain a plurality of first sampling clock signals, sample the first pulse signal by using the plurality of first sampling clock signals, and output the first conversion code; and a second conversion module configured to receive the second pulse signal, perform sampling and delay by using the second pulse signal to obtain a plurality of second sampling clock signals, sample the second pulse signal by using the plurality of second sampling clock signals, and output the second conversion code.

7. The delay locked loop of claim 6, wherein the preprocessing module is further configured to preprocess the initial clock signal, and output the first clock signal, the second clock signal, a third clock signal and a fourth clock signal, the delay locked loop further comprises:

a third regulable delay line configured to receive the third clock signal, regulate and transmit the third clock signal, and output a third target clock signal, wherein a phase difference between the first target clock signal and the third target clock signal is 180 degrees;

a fourth regulable delay line configured to receive the fourth clock signal, regulate and transmit the fourth clock signal, and output a fourth synchronization clock signal; and a second regulation module configured to receive the third target clock signal and the fourth synchronization clock signal, regulate delay of the fourth synchronization clock signal based on the third target clock signal, and output a fourth target clock signal, wherein a phase difference between adjacent two of the first target clock signal, the second target clock signal, the third target clock signal and the fourth target clock signal is 90 degrees.

8. The delay locked loop of claim 7, wherein the phase division module is further configured to perform frequency division and phase division on the to-be-processed clock signal, and output the first clock signal, the second clock signal, the third clock signal and the fourth clock signal, wherein the first clock signal, the second clock signal, the third clock signal and the fourth clock signal have the same clock cycle, and the clock cycle of the first clock signal is twice the clock cycle of the initial clock signal.

9. The delay locked loop of claim 8, wherein the second regulation module comprises:

a second control module configured to receive the third target clock signal and the fourth synchronization clock signal, and output a second control code based on a phase difference between the third target clock signal and the fourth synchronization clock signal; and a second delay chain comprising a plurality of second delay units, and configured to receive the second control code and the fourth synchronization clock signal, regulate the delay of the fourth synchronization clock signal by using the plurality of second delay units based on the second control code, and output the fourth target clock signal.

10. The delay locked loop of claim 9, wherein the second control module comprises:

a second pulse processing module configured to receive the third target clock signal and the fourth synchronization clock signal, and output a third pulse signal and a fourth pulse signal, wherein each of the third pulse signal and the fourth pulse signal comprises one pulse, a pulse width of the third pulse signal indicates the phase difference between the third target clock signal and the fourth synchronization clock signal, and a pulse width of the fourth pulse signal indicates a phase difference between an inverted signal of the third target clock signal and the fourth synchronization clock signal;

a second time-to-digital conversion module configured to receive the third pulse signal and the fourth pulse signal, convert the third pulse signal and output a third conversion code, and convert the fourth pulse signal and output a fourth conversion code, wherein the third conversion code characterizes a width of the third pulse signal, and the fourth conversion code characterizes a width of the fourth pulse signal; and a second logic module configured to receive the third conversion code and the fourth conversion code, perform a subtraction operation on the fourth conversion code and the third conversion code, and output the second control code.

11. The delay locked loop of claim 10, wherein the second pulse processing module comprises:

a third pulse module configured to receive the third target clock signal and the fourth synchronization clock signal, perform an XOR operation on the third target clock signal and the fourth synchronization clock signal and obtain a third detection signal, perform pulse interception and broadening on the third detection signal and obtain a third intermediate signal, and perform an AND operation on the third intermediate signal and the third detection signal and output the third pulse signal, wherein the third detection signal comprises a plurality of pulses, a pulse width of the third detection signal indicates the phase difference between the third target clock signal and the fourth synchronization clock signal, the third intermediate signal comprises one pulse, and a pulse width of the third intermediate signal is greater than the pulse width of the third detection signal; and a fourth pulse module configured to receive the inverted signal of the third target clock signal and the fourth synchronization clock signal, perform an XOR operation on the inverted signal of the third target clock signal and the fourth synchronization clock signal and obtain a fourth detection signal, perform pulse interception and broadening on the fourth detection signal and obtain a fourth intermediate signal, and perform an AND operation on the fourth intermediate signal and the fourth detection signal and output the fourth pulse signal, wherein the fourth detection signal comprises a plurality of pulses, a pulse width of the fourth detection signal indicates the phase difference between the inverted signal of the third target clock signal and the fourth synchronization clock signal, the fourth intermediate signal comprises one pulse, and a pulse width of the fourth intermediate signal is greater than the pulse width of the fourth detection signal.

12. The delay locked loop of claim 11, wherein the second time-to-digital conversion module comprises:

a third conversion module configured to receive the third pulse signal, sample and delay the third pulse signal to obtain a plurality of third sampling clock signals, sample the third pulse signal by using the plurality of third sampling clock signals, and output the third conversion code; and a fourth conversion module configured to receive the fourth pulse signal, sample and delay the fourth pulse signal to obtain a plurality of fourth sampling clock signals, sample the fourth pulse signal by using the plurality of fourth sampling clock signals, and output the fourth conversion code.

13. The delay locked loop of claim 11, wherein the first pulse module comprises a first trigger, a second trigger, a first NOT gate, a fourth delay unit, a first AND gate, a first XOR gate and a second AND gate, and wherein each of the second pulse module, the third pulse module and the fourth pulse module has the same structure as the first pulse module, in the first pulse module, a first input end of the first XOR gate receives the first target clock signal, a second input end of the first XOR gate receives the second synchronization clock signal, and an output end of the first XOR gate outputs the first detection signal; an input end of the first trigger receives a first power signal, and a clock end of the first trigger is connected to the output end of the first XOR gate; an input end of the first NOT gate is connected to the output end of the first XOR gate, an input end of the second trigger receives a grounding signal, and an output end of the second trigger is connected to an output end of the first NOT gate; an input end of the fourth delay unit is connected to the output end of the second trigger, a first input end of the first AND gate is connected to an output end of the first trigger, a second input end of the first AND gate is connected to an output end of the fourth delay unit, and an output end of the first AND gate outputs the first intermediate signal; a first input end of the second AND gate is connected to the output end of the first AND gate, a second input end of the second AND gate is connected to the output end of the first XOR gate, and an output end of the second AND gate outputs the first pulse signal.

14. The delay locked loop of claim 12, wherein each of the first conversion code, the second conversion code, the third conversion code and the fourth conversion code comprises a plurality of sub-signals, the first conversion module comprises a third trigger, a third delay chain and a plurality of fourth triggers, and each of the second conversion module, the third conversion module and the fourth conversion module has the same structure as the first conversion module, in the first conversion module, an input end of the third trigger receives a second power signal, a clock end of the third trigger receives the first pulse signal, and an output end of the third trigger is connected to an input end of the third delay chain; input ends of all of the fourth triggers receive the first pulse signal; the third delay chain comprises a plurality of third delay units arranged in series, a clock end of each of the fourth triggers is connected to an output end of a respective one of the third delay units, and an output end of each of the fourth triggers outputs a respective one of the sub-signals of the first conversion code.

15. The delay locked loop of claim 14, wherein the first delay chain comprises a plurality of first delay units arranged in series, and the second delay chain comprises the plurality of second delay units, the first delay unit in the first delay chain, the second delay unit in the second delay chain, and the third delay unit in the third delay chain are the same correspondingly.

16. The delay locked loop of claim 15, wherein an i-th sub-signal of the first control code is configured to control an i-th first delay unit to be in a turn-on or turn-off state, and an i-th sub-signal of the second control code is configured to control an i-th second delay unit to be in a turn-on or turn-off state, the first delay chain is configured to delay the second synchronization clock signal by using the first delay unit in the turn-on state, and output the second target clock signal, the second delay chain is configured to delay the fourth synchronization clock signal by using the second delay unit in the turn-on state, and output the fourth target clock signal.

17. The delay locked loop of claim 16, wherein each of first a sub-signals of the first control code is in a first state, and each of last (A-a) sub-signals of the first control code is in a second state; each of first b sub-signals of the second control code is in a first state, and each of last (B-b) sub-signals of the second control code is in a second state, wherein each of A, B, a and b is a positive integer, a is less than or equal to A, A denotes a total number of sub-signals in the first control code, b is less than or equal to B, and B refers to a total number of sub-signals in the second control code, the first delay chain is configured to delay the second synchronization clock signal by using first to a-th ones of the first delay units, and determine an output signal of the a-th one of the first delay units as the second target clock signal, the second delay chain is configured to delay the fourth synchronization clock signal by using first to b-th ones of the second delay units, and determine an output signal of the b-th one of the second delay units as the fourth target clock signal.

18. The delay locked loop of claim 1, wherein the first target clock signal, the second target clock signal, the third target clock signal and the fourth target clock signal are applied to data sampling and processing after passing through signal transmission paths, the delay locked loop further comprises:

a feedback module configured to receive the first clock signal and output an analog clock signal, wherein the analog clock signal simulates a waveform of the first target clock signal after the first target clock signal passes through the signal transmission path;

a detection module configured to receive the first clock signal and the analog clock signal, perform phase detection on the first clock signal and the analog clock signal, and obtain a phase detection signal; and a parameter regulation module configured to receive the phase detection signal, and output a delay line control signal based on the phase detection signal, wherein the first regulable delay line is configured to receive the delay line control signal, regulate and transmit the first clock signal based on the delay line control signal, and output the first target clock signal, the second regulable delay line is configured to receive the delay line control signal, regulate and transmit the second clock signal based on the delay line control signal, and output the second synchronization clock signal.

19. The delay locked loop of claim 18, wherein the feedback module comprises:

a fifth regulable delay line configured to receive the first clock signal and the delay line control signal, regulate and transmit the first clock signal based on the delay line control signal, and output a replica clock signal, wherein the fifth regulable delay line has the same structure as the first regulable delay line, and the replica clock signal simulates the waveform of the first target clock signal; and a replica delay module configured to receive the replica clock signal, delay the replica clock signal, and output the analog clock signal, wherein the replica delay module is configured to simulate delay of the signal transmission path.

20. A memory, comprising the delay locked loop, which comprises:

a preprocessing module configured to receive an initial clock signal, preprocess the initial clock signal, and output a first clock signal and a second clock signal;

a first regulable delay line configured to receive the first clock signal, regulate and transmit the first clock signal, and output a first target clock signal;

a second regulable delay line configured to receive the second clock signal, regulate and transmit the second clock signal, and output a second synchronization clock signal; and a first regulation module configured to receive the first target clock signal and the second synchronization clock signal, regulate delay of the second synchronization clock signal based on the first target clock signal, and output a second target clock signal, wherein a phase difference between the first target clock signal and the second target clock signal is a preset value.

* * * * *